United States Patent
Birkmayer (10) Patent No.: US 11,594,997 B2
(45) Date of Patent: Feb. 28, 2023

(54) METHOD AND CIRCUIT ARRANGEMENT FOR DETERMINING AN INCORRECT OPERATING STATE OF AN ELECTRICAL MACHINE

(71) Applicant: Wolfram Siegfried Birkmayer, Hirschaid-Seigendorf (DE)

(72) Inventor: Wolfram Siegfried Birkmayer, Hirschaid-Seigendorf (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 9 days.

(21) Appl. No.: 17/031,373

(22) Filed: Sep. 24, 2020

(65) Prior Publication Data
US 2021/0099121 A1    Apr. 1, 2021

(51) Int. Cl.
*H02P 29/024* (2016.01)
*H02P 25/092* (2016.01)
*H02P 7/295* (2016.01)
*H02P 6/18* (2016.01)

(52) U.S. Cl.
CPC ............ *H02P 29/026* (2013.01); *H02P 7/295* (2013.01); *H02P 25/0925* (2016.02); *H02P 6/183* (2013.01)

(58) Field of Classification Search
CPC ............... G01R 31/343; H02P 25/0925; H02P 29/024; H02P 29/026; H02P 7/295; H02P 6/183; G01S 13/931
USPC .......................... 318/400.2; 310/201; 342/70
See application file for complete search history.

(56) References Cited

U.S. PATENT DOCUMENTS 5,565,752 A * 10/1996 Jansen ................. H02P 6/183
                                                         310/201
5,654,715 A *  8/1997 Hayashikura ........ G01S 13/931
                                                          342/70
2010/0253265 A1  10/2010 Clothier

FOREIGN PATENT DOCUMENTS

| DE | 69608638 T2    | 9/2000 |
| DE | 102008020731 A1 | 11/2009 |
| DE | 102015118867 A1 | 5/2016 |
| WO | 2019150091 A1  | 8/2019 |

OTHER PUBLICATIONS

German Search Report for German Application No. 10 2019 215 014.4 dated Sep. 14, 2020.

\* cited by examiner

*Primary Examiner* — Bickey Dhakal
*Assistant Examiner* — Zemenay T Truneh
(74) *Attorney, Agent, or Firm* — Lempia Summerfield Katz LLC (57) ABSTRACT

The disclosure relates to a method for determining an incorrect operating state of an electrical machine with the aid of an electronic circuit having at least one comparator. The electrical machine is controlled with a pulse width modulation signal. The pulse width modulation signal is demodulated. A first signal, which represents the demodulated pulse width modulation signal, is compared with a second signal. The second signal represents a rotational speed or a rotational angle of the electrical machine and/or a current intensity of the electrical machine. This comparison is carried out with the aid of the at least one comparator. An error signal is generated based on the comparison in order to determine the incorrect operating state of the electrical machine.

13 Claims, 5 Drawing Sheets

METHOD AND CIRCUIT ARRANGEMENT FOR DETERMINING AN INCORRECT OPERATING STATE OF AN ELECTRICAL MACHINE

The present patent document claims the benefit of German Patent Application No. 10 2019 215 014.4, filed Sep. 30, 2019, which is hereby incorporated by reference.

TECHNICAL FIELD

The disclosure relates to a method for determining an incorrect operating state of an electrical machine with the aid of an electronic circuit. The disclosure also relates to a switching arrangement having at least one comparator for determining an incorrect operating state of an electrical machine.

BACKGROUND

A high degree of reliability is required in certain applications with electrical machines. Here, it may be desirable for a drive to operate safely and reliably. Such applications may arise, in the automotive sector, in aviation, or in machine tools. Operation of the electrical machine may be checked by controlling an underlying control algorithm.

SUMMARY AND DESCRIPTION

An object of the disclosure may be considered that of providing a method for checking the operating state of an electrical machine with an error rate which is as low as possible.

The scope of the present disclosure is defined solely by the appended claims and is not affected to any degree by the statements within this summary. The present embodiments may obviate one or more of the drawbacks or limitations in the related art.

It has hitherto been conventional to check or safeguard operation of an electrical machine using software. An inverter may be used to convert a motor current signal into a pulse width modulation signal for controlling the electrical machine. Correct operation of the inverter may be determined, for example, with the aid of software checks.

For this purpose, a measured motor current or a position of the motor may be converted into a pulse width modulation signal. The position of the motor may be a relative position of a rotor with respect to a stator. Alternatively, or additionally, the position of the motor may be a rotational angle between the rotor and the stator. This pulse width modulation signal may be compared with measured control parameters. Alternatively, the pulse width modulation signal may be used to create a prediction which may be compared with measured parameters. The checking of the operating state of the electrical machine may be referred to as a consistency check. This consistency check may have been carried out using a microprocessor which executes a software application. Common microprocessors currently have a failure rate of approximately $10^{-5}$ failures per hour.

The disclosure is based on the knowledge that consistency checks may be implemented using hardware. In this example, a hardware consistency check may achieve failure rates of $10^{-9}$ failures per hour.

The disclosure provides a method for determining an incorrect operating state of an electrical machine with the aid of an electronic circuit which has at least one comparator. For this purpose, the following method acts are carried out.

The electrical machine is controlled with the aid of a pulse width modulation signal. The pulse width modulation signal may be generated with the aid of an inverter. The inverter may have a control unit and a power electronic unit.

In a further act, the pulse width modulation signal is demodulated. The pulse width modulation signal may be demodulated with the aid of a low-pass filter, for example. A demodulated technical variable may correspond to an equivalent value and may therefore correspond to an average height of an area below the modulated variable. The pulse width modulation signal may be a square-wave signal, for example, and the demodulated pulse width modulation signal may be sinusoidal, for example.

In a further act, a first signal, which represents the demodulated pulse width modulation signal, is compared with a second signal. In this example, the second signal represents a rotational speed or a rotational angle of the electrical machine and/or a current intensity of the electrical machine. A temporal profile of the current intensity and of the rotational angle may respectively be sinusoidal. The comparison is carried out with the aid of the at least one comparator. The first signal may therefore be considered to be a signal which is derived from the demodulated pulse width modulation signal or is based on a demodulated signal. The second signal may represent reference values or reference signals. Depending on the application, a plurality of or different reference values or reference signals may be used for one or more comparisons. The comparator is configured, in particular, to compare the first signal with the second signal.

During the comparison, numerical values may be respectively compared with one another. A signal profile may be additionally compared with a numerical value. Furthermore, two signals which may each have their own profile may be compared with one another during the comparison. For this purpose, the comparison may include a similarity analysis, a correlation, etc.

In a further act, an error signal is generated based on the comparison in order to determine the incorrect operating state of the electrical machine. The error signal may contain, in particular, information relating to a defect or an incorrect setting on the electrical machine. Alternatively, instead of the error signal, a confirmation signal may be generated based on the comparison. Alternatively, instead of the error signal, a confirmation signal may be generated based on the comparison. In this example, the method may be used to check a functionality of the electrical machine or to determine a correct operating state of the electrical machine.

If the error signal is mentioned below, the confirmation signal may likewise be referred to. The method and its developments may be correspondingly and analogously used to generate the confirmation signal. The same applies to the switching arrangement.

The first signal and/or the second signal may each be a voltage signal. The second signal may thus be a voltage signal, but this voltage signal may represent a current intensity of the electrical machine. For example, a current intensity measuring sensor may be used to measure a voltage representing the current intensity. A similar situation may be the case for the rotational speed or the rotational angle of the electrical machine. An error signal may be generated if a deviation which exceeds a predefined threshold value is determined during the comparison. A microprocessor, in particular, is not required when comparing the first signal with the second signal. The comparison may therefore be enabled using hardware. The method for determining the incorrect operating state of the electrical machine may therefore be implemented purely using hardware without using software. This makes it possible to provide a checking mechanism for correct operation of the electrical machine which is particularly fail-safe (e.g., $10^{-9}$ failures per hour).

An additional or alternative development of the method provides for a first relative signal to be generated from the first signal and from the second signal using a lock-in amplifier or a quadrature demodulator, wherein the first relative signal describes an amplitude ratio of the first and second signals with respect to one another. The amplitude ratio may be, in particular, in the form of a quotient of the amplitude of the first signal to the amplitude of the second signal. A reverse definition is likewise possible. If the first signal has an amplitude which is twice as large as that of the second signal, for example, the first relative signal is 2:1=2. The first relative signal may therefore have a reference to the first signal and to the second signal. The respective amplitudes of the first and second signals may thus be linked with a signal, the first relative signal.

The lock-in amplifier may be, in particular, in the form of an amplifier for measuring a weak electrical signal. A frequency and a phase, for example, of the weak electrical signal are modulated. The lock-in amplifier may be a narrowband bandpass filter and may improve a signal-to-noise ratio. DC voltages or AC voltages of another frequency and noise may be efficiently filtered.

An additional or alternative development of the method provides for the first relative signal to be generated from the first signal and from the second signal using an amplitude detector, wherein the first relative signal describes an amplitude ratio of the first and second signals with respect to one another. The amplitude ratio may be, in particular, in the form of a quotient of the amplitude of the first signal to the amplitude of the second signal. A reverse definition is likewise possible. If the first signal has an amplitude which is twice as large as that of the second signal, for example, the first relative signal is 2:1=2. The first relative signal may therefore have a reference to the first signal and to the second signal. The respective amplitudes of the first and second signals may thus be linked with a signal, e.g., the first relative signal.

The first relative signal may be compared with a predefined minimum amplitude reference value with the aid of the first comparator. The first relative signal may be compared with a predefined maximum amplitude reference value by a second comparator. The minimum amplitude reference value may be reduced by a first tolerance value. The maximum amplitude reference value may be increased by a second tolerance value. A correct operating state of the electrical machine (e.g., confirmation signal) may be determined if the first relative signal is between the minimum and maximum amplitude reference values.

Additionally, or alternatively, the incorrect operating state of the electrical machine (e.g., error signal) may be determined if the first relative signal is outside a range defined by the minimum and maximum amplitude reference values. At the same time, a time condition may be taken into account during the comparison. If it is determined, for example, that the first relative signal changes in a predefined period by at least a defined amount which results in the determination of the incorrect operating state, this may indicate a software error of the electrical machine. In this example, the comparison could show that the control signals (e.g., pulse width modulation signals) fluctuate too highly, that is to say change too quickly. It may be stated that the control signals (e.g., PWM signals) "jump too much". This may indicate that particular control parameters of the electrical machine have been set incorrectly or there is a software error.

If the first relative signal includes an item of information relating to the rotational speed or rotational angle of the electrical machine, for example, a determined incorrect operating state of the electrical machine could indicate a hardware defect of the electrical machine. This could be the case, for example, when the pulse width modulation signal has a sawtooth profile instead of a sinusoidal profile. The first relative signal may therefore be analyzed not only with respect to its amplitude but alternatively or additionally with respect to its profile. The comparison may therefore mean not only a comparison of two values with one another, but rather a shape or a profile of the relative signal may also be analyzed with the aid of the comparison. If the minimum or maximum amplitude reference values are not reached at the predefined time, for example, this may indicate an error.

An additional or alternative development of the method provides for a second relative signal to be generated from the first signal and from the second signal using a lock-in amplifier. The lock-in amplifier for generating the second relative signal may be the same lock-in amplifier as that for generating the first relative signal. Alternatively, a first lock-in amplifier may be used to generate the first relative signal, and a second lock-in amplifier may be used to generate the second relative signal. However, these two lock-in amplifiers may be identical. In this example, the second relative signal describes a phase shift from the first signal to the second signal. The second relative signal is compared with a predefined minimum phase reference value by a third comparator. The second relative signal is compared with a predefined maximum phase reference value with the aid of a fourth comparator. The examples and explanations mentioned in connection with the first relative signal correspondingly and analogously apply to the development with respect to the second relative signal.

An additional or alternative development of the method provides for the second relative signal to be generated from the first signal and from the second signal using a phase detector. In this example, the second relative signal describes a phase shift from the first signal to the second signal. The second relative signal is compared with a predefined minimum phase reference value by the third comparator. The second relative signal is compared with a predefined maximum phase reference value with the aid of the fourth comparator. The examples and explanations mentioned in connection with the first relative signal correspondingly and analogously apply to the development with respect to the second relative signal. The first, second, third, and fourth comparators may each be designed separately, in particular. Depending on the application, functions of two or more comparators may be combined in one comparator.

An additional or alternative development of the method provides for the minimum amplitude reference value and/or the minimum phase reference value to be reduced for a predefined time during the comparison and/or for the maximum amplitude reference value and/or the maximum phase reference value to be increased for the predefined period. The predefined period may be provided using hardware with the aid of a counting unit for current pulses. The minimum reference values for the amplitude and the phase may therefore be reduced for the predefined period and the maximum reference values may accordingly be increased. It is also possible for only the minimum amplitude reference value or the minimum phase reference value to be reduced.

Provision may likewise be made for only the maximum amplitude reference value or the maximum phase reference value to be increased for the predefined period. Such a comparison may be useful, for example, when changing over the electrical machine. If, for example, the electrical machine is switched from a first state into a second state, higher current intensities than in the first or second state may temporarily occur. These higher current intensities may accordingly be reflected in the first and/or second relative signal. In order to avoid detecting or declaring desired or required changing over of the electrical machine as an incorrect operating state, it may be useful to increase or reduce the respective amplitude reference values or phase reference values according to the predefined period. It is therefore possible to achieve the situation in which changing over of the electrical machine does not result in an incorrect state of the electrical machine being incorrectly determined.

An additional or alternative development of the method provides for the error signal to be generated if the first relative signal is outside an amplitude range defined by the minimum and maximum amplitude reference values. Alternatively, the error signal is generated if the second relative signal is outside a phase range defined by the minimum and maximum phase reference values. The error signal may be generated when the first and/or second relative signal is outside the respectively predefined ranges.

An additional or alternative development of the method provides for a third relative signal to be formed from the first signal by a differentiator, and for the differentiator, in conjunction with a voltage-controlled oscillator (VCO), to modulate the amplitude of the first relative signal in such a manner that the frequency of the third relative signal corresponds to a frequency of the first signal, of the demodulated signal or of the second signal. The first relative signal may be the third relative signal. It is therefore possible to achieve the situation in which the first signal and the third relative signal have the same frequency. The third relative signal may be compared with a further reference signal by the at least one comparator. The further reference signal may be a speed reference value, the motor current signal, or the second signal. In this example, the first signal represents the demodulated pulse width modulation signal. In order to determine the rotational speed and to compare it with a threshold value or a reference value of a maximum rotational speed, that amplitude which is used to control the voltage-controlled oscillator is required, in particular.

Examples and features of other developments may be correspondingly and analogously applied to developments with the differentiator.

The voltage-controlled oscillator may be, in particular, an electrical oscillator. A frequency of the voltage-controlled oscillator may be changed by a magnitude or amplitude of an applied voltage (e.g., control or regulating voltage). The voltage-controlled oscillator may be used for frequency modulation, for example.

The voltage-controlled oscillator is, in particular, an oscillator in which frequency tuning may be carried out by a capacitance diode. The voltage-controlled oscillator may be controlled by a variable DC voltage. This is applied, for example, to the capacitance diode which thereby changes its capacitance.

The capacitance diode may be part of a resonant circuit capacitance and, as a result of the applied control voltage, causes a frequency change inside the tunable frequency band. A ratio between a highest oscillator frequency and a lowest oscillator frequency may result from the parallel circuit including the resonant circuit capacitor and the capacitance diode, to be precise, in particular, if the capacitance diode has its highest and lowest capacitance.

The differentiator may have a circuit designed in such a manner that an output of the circuit is approximately directly proportional to a change rate (e.g., of the temporal derivative) of an input. The differentiator may include a gain or may have an amplification unit. A true or ideal differentiator may not be physically implemented, in particular, because it has an infinite gain for an infinite frequency. A similar effect may be achieved, however, by limiting the gain over a particular frequency. An active differentiator may have a type of amplifier, whereas a passive differentiator has, in particular, only resistors, capacitors, and inductances.

A circuit for the differentiator (e.g., differentiation circuit) may output, in particular, a derivative of an input signal over a frequency range based on a circuit time constant and a bandwidth of an amplifier. The input signal may be applied, for example, to an inverting input, with the result that an output is inverted relative to the polarity of the input signal. The ideal differentiation circuit may be unstable, in particular. It may be necessary to add an input resistor, a feedback capacitor, or both. As a result, the differentiation circuit may be designed to be stable. The components required for the stability may limit the bandwidth over which a differentiation function is carried out.

Alternatively, the differentiator, in conjunction with the voltage-controlled oscillator, may modulate the amplitude of the first signal in such a manner that the frequency of the third relative signal formed therefrom corresponds to a frequency of the second signal. The second signal may represent, for example, a current intensity which is obtained or measured by the inverter. The third relative signal may thus accordingly be compared with an associated reference signal. In this example, it may be provided that a phase-distorted comparison is not carried out.

The respective amplitude reference values or phase reference values may each be amplitude reference signals or phase reference signals. This applies to all reference values which are used for the comparison. For example, the first relative signal may be compared with a maximum amplitude reference signal. As a result, two signals may be compared with one another in each case.

An additional or alternative development of the method provides for an output voltage which respectively results with the aid of a plurality of comparators during each comparison to be supplied to an AND gate. An AND gate may be considered to be, for example, a gate having a plurality of inputs and one output. The output provides, in particular, a "1 signal" precisely when a respective 1 signal is present at all inputs. The AND gate therefore corresponds, in particular, to a logical AND. An error signal or a confirmation signal may therefore be generated if a plurality of conditions are met at the same time. For example, an incorrect operating state of the electrical machine may be determined when the first or second relative signal is outside a predefined range and a predefined time condition is met at the same time. In this example, in addition to an excessively large deviation of the first or second relative signal with respect to the respective reference signal, the time condition would additionally have to be met in order to generate the confirmation signal. The predefined time condition may in turn be implemented using hardware, for example, with the aid of a current pulse counter.

In order to demodulate the pulse width modulation signal, an additional or alternative development of the method provides for the pulse width modulation signal to be converted into a pulse amplitude modulation signal, and for the pulse amplitude modulation signal to be supplied to a low-pass filter. Additionally, after the conversion, locally generated pulses (e.g., offset values) may be added to the pulse amplitude modulation signal. The pulse amplitude modulation signal modified in this manner may then be supplied to a pulse amplitude demodulation. The pulse amplitude demodulation may be carried out, for example, with the aid of a low-pass filter.

So-called delta peaks or a square-wave pulse may be generated with the aid of the conversion of the pulse width modulation signal into the pulse amplitude modulation signal. For this purpose, the pulse amplitude signal may be clipped by a clipper after adding the offset values. A residual remainder of the clipped pulse amplitude signal may be converted into a delta peak. Such delta peaks correspond, in particular, to a mathematical delta distribution. A delta distribution may also be referred to as an impulse function, a needle pulse, a delta peak, or a pulse function. The pulse amplitude modulation signal in the form of the delta distribution may therefore be generated from the pulse width modulation signal. Such a signal may be processed well with the aid of the low-pass filter. Signal interference may be reduced in this manner.

The disclosure likewise provides a switching arrangement having at least one comparator for determining an incorrect operating state of an electrical machine. The switching arrangement has a control unit for controlling the electrical machine with a pulse width modulation signal. The control unit is therefore designed to control the electrical machine with the aid of the pulse width modulation signal. The switching arrangement also includes a demodulation unit for demodulating the pulse width modulation signal. The at least one comparator is configured to compare a first signal, which represents the demodulated pulse width modulation signal, with a second signal, which represents a rotational speed or rotational angle of the electrical machine and/or a current intensity of the electrical machine. The comparator and/or the control unit is/are designed to generate an error signal, or a confirmation signal based on the comparison. This is used to determine the incorrect or correct operating state of the electrical machine. The embodiments, advantages, and examples of the described methods which have already been mentioned correspondingly and analogously apply to the switching arrangement.

An additional or alternative embodiment provides a switching arrangement having a lock-in amplifier. The lock-in amplifier is used to generate a first relative signal and a second relative signal in order to compare one of the two relative signals with a further reference signal by the at least one comparator. The first relative signal describes an amplitude ratio of the first and second signals with respect to one another. The second relative signal describes a phase shift from the first signal to the second signal.

An additional or alternative embodiment provides a switching arrangement having an amplitude detector and a phase detector. The amplitude detector is used to generate the first relative signal, and the phase detector is used to generate the second relative signal, in order to compare one of the two relative signals with a further reference signal by the at least one comparator. The first relative signal describes the amplitude ratio of the first and second signals with respect to one another. The second relative signal describes the phase shift from the first signal to the second signal.

The switching arrangement also provides at least one AND gate connected to an output signal from the at least one comparator. Two signals may be relatively compared with one another in terms of their amplitude or phase with the aid of the lock-in amplifier. Logic AND circuits may be implemented with the aid of the AND gate.

In an additional or alternative embodiment, the switching arrangement has at least one pulse counter for predefining a period. In this example, the pulse counter is connected to the at least one AND gate. The pulse counter may be interpreted as a counting unit. In this example, the at least one pulse counter and the at least one comparator are connected to the at least one AND gate. The comparison of the relative signals with the associated reference signals may thus be additionally made dependent on a period. The reference signals may be in the form of the minimum or maximum amplitude reference signal and/or the minimum or maximum phase reference signal.

The described possibilities of the comparison may be used for any electrical phase of the electrical machine or its motor. Many electrical machines are operated with a three-phase current, for example. In this case, the described examples of the developments and of the switching arrangement may apply to any of the individual phases u, v, w.

In an electrical machine with a motor without faults, the second relative signal (e.g., angle phi) may be in a range of 0 to 35 degrees. A current intensity, as the second signal, may assume values of between 0 and 330 amperes. An associated voltage may assume values of between 25 and 230 volts, for example. A ratio of the voltage to the current may be 180 V/A (voltage/current=180 V/A), for example, in the case of a low torque. In the case of a larger or maximum torque, the ratio may be 1 V/A, for example. Comparing the first signal with the second signal makes it possible to reliably capture or register "unhealthy" values which occur and indicate a malfunction of the electrical machine. As already described, the first and/or second relative signal may be formed during this comparison in order to compare the first signal with the second signal.

The explanations, advantages, and examples of the developments of the method correspondingly and analogously apply to all apparatus claims and embodiments of the switching arrangement. Embodiments, examples, and advantages of the circuit arrangement may likewise be interpreted as corresponding method features. All method acts may be implemented by corresponding concrete apparatus features. The switching arrangement is configured, in particular, to carry out the method described above.

BRIEF DESCRIPTION OF THE DRAWINGS

The disclosure is explained in more detail below based on exemplary drawings. These drawings represent background knowledge or developments or embodiments of the disclosure. However, the drawings should not be understood as the only exemplary embodiments. The disclosure is therefore not limited to the exemplary embodiments shown in the figures and may accordingly also include further exemplary embodiments.

DETAILED DESCRIPTION

Figure 1:
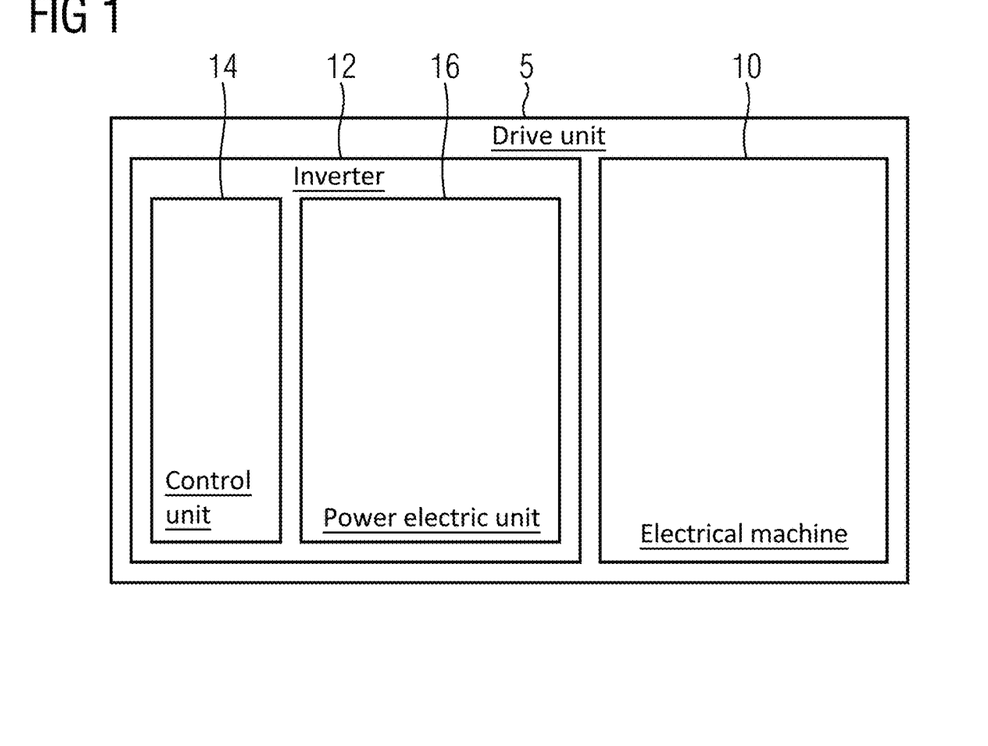
FIG. 1 depicts an exemplary schematic structure of a drive unit.

FIG. 1 schematically shows a drive unit 5 having a plurality of components. The drive unit 5 has an electrical machine 10 and an inverter 12. The inverter 12 includes a control unit 14 and a power electronic unit 16.

The disclosure is based on the knowledge that the inverter 12 may be protected or monitored using software. A microprocessor 14d may be used for this purpose. For this purpose, the microprocessor 14d may include algorithms in order to monitor a hardware function of the electrical machine 10. Predefined voltage ranges may be monitored for this purpose, in particular. The inverter 12 may be monitored with the aid of a consistency check CHM. For this purpose, measured parameters (e.g., measuring the voltage of pulse width modulation) or intermediate values of a control algorithm are compared with predictions of a position of a part of the electrical machine 10, for example. The electrical machine 10 may be controlled with the aid of a pulse width modulation signal PWM. This pulse width modulation signal PWM may be measured. It is thus possible to obtain a first signal S1 which represents a demodulated pulse width modulation signal V10.

A prediction of a motor position of the electrical machine 10 may be made with the aid of the pulse width modulation signal PWM. The motor position may be represented by a rotational angle between the stator and the rotor. This prediction may be represented by a further signal. The prediction may be determined by the microprocessor 14d. The microprocessor 14d may compare these two signals with one another for the consistency check CHM. The electrical machine 10 may have a plurality of phases. In particular, the electrical machine 10 may have the conventional three phases for three-phase current or alternating current. These three phases may be referred to as u, v, w.

The control unit 14 of the inverter 12 generates a pulse width modulation signal PWM which is amplified with the aid of the power electronic unit 16. The electrical machine 10 may be operated with the signal. The consistency check CHM of the control algorithm, carried out by the microprocessor 14d, may be carried out with the aid of a software application executed on the microprocessor 14d.

Figure 2:
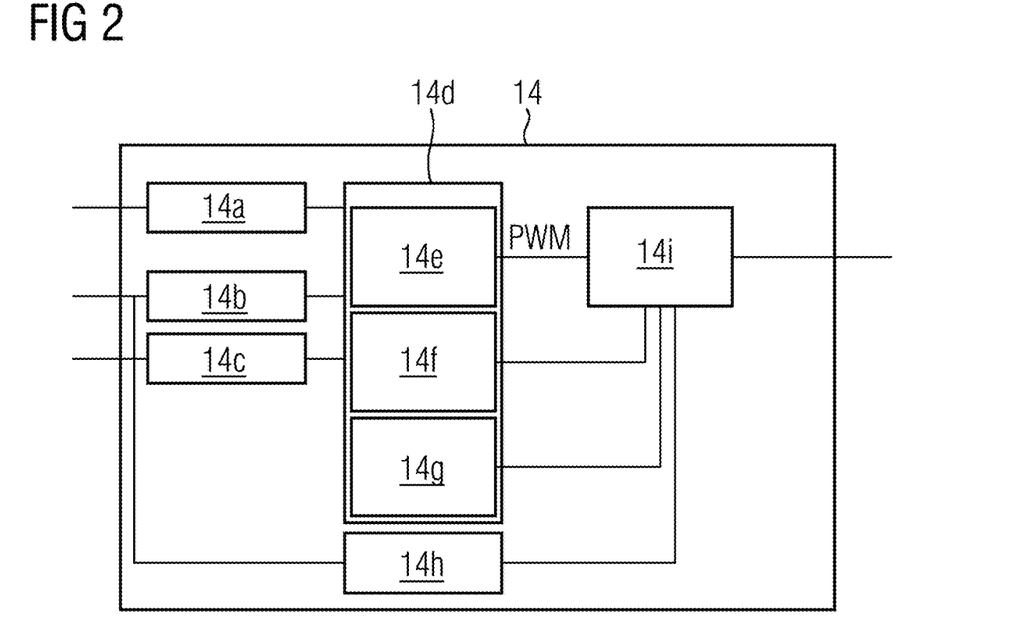
FIG. 2 depicts an exemplary schematic structure of a control unit having a microprocessor.

FIG. 2 shows an example of how the control unit 14 may be structured. Parameters for the consistency check CHM may be read in or stored in a memory 14a of the microprocessor 14d. The control unit 14 may additionally receive control signals via an interface 14b. The control unit 14 may have an analog/digital converter 14c. The data from the memory 14a, the interface 14b, and the analog/digital converter 14c may be converted in the microprocessor 14d. The microprocessor 14d may have a PWM generator 14e, a microprocessor protection unit 14f, and a machine protection unit 14g. The PWM generator 14e, the machine protection unit 14g, and the microprocessor protection unit 14f may be implemented using software in this case. The control unit 14 may additionally have a further hardware protection unit 14h. The pulse width modulation signal PWM generated by the PWM generator 14e may be activated with the aid of the microprocessor protection unit 14f, the machine protection unit 14g, and the hardware protection unit 14h. For this purpose, the signals from these components may be combined to form an activation unit 14i. The pulse width modulation signal PWM may therefore be checked using software. In the case of a successful check, the PWM signal may be output to the power electronic unit 16 in order to control the electrical machine 10.

The microprocessor 14d illustrated in FIG. 2 may have a failure rate of approximately $10^{-5}$ failures per hour. For certain applications, it may be necessary to provide a consistency check CHM with a lower failure rate. In such cases, it may be desirable, for example, for the drive unit 5 to be reliably monitored. In this case, the intention is to monitor, for example, that the amplitudes of the currents to the respective phases of the electrical machine 10 are similar or match one another. At the same time, an angular velocity of the electrical machine 10 should be below a maximum rotational speed, for example.

The disclosure is based on the knowledge that it is possible to achieve the consistency check CHM with a failure rate of approximately $10^{-9}$ failures per hour with the aid of hardware monitoring. Consequently, hardware monitoring or a hardware consistency check CHM may be more suitable than software monitoring for certain applications.

Hardware monitoring may be implemented with the aid of a switching arrangement 100, for example. The switching arrangement 100 may measure an output voltage of the pulse width modulation signal PWM, which is provided by the inverter 12, as the first signal S1. This voltage may be compared with a motor current MC with the aid of a comparator 1. For this purpose, a second signal S2 may represent the motor current MC. Such hardware monitoring of the electrical machine 10 may be enabled in many cases using a simple switching arrangement 100 having a failure rate of $10^{-9}$ failures per hour or lower. The switching arrangement may likewise have a control unit 14, wherein the control unit 14 does not have a microprocessor 14d in this example or a microprocessor 14d is not used for the comparison.

Figure 3:
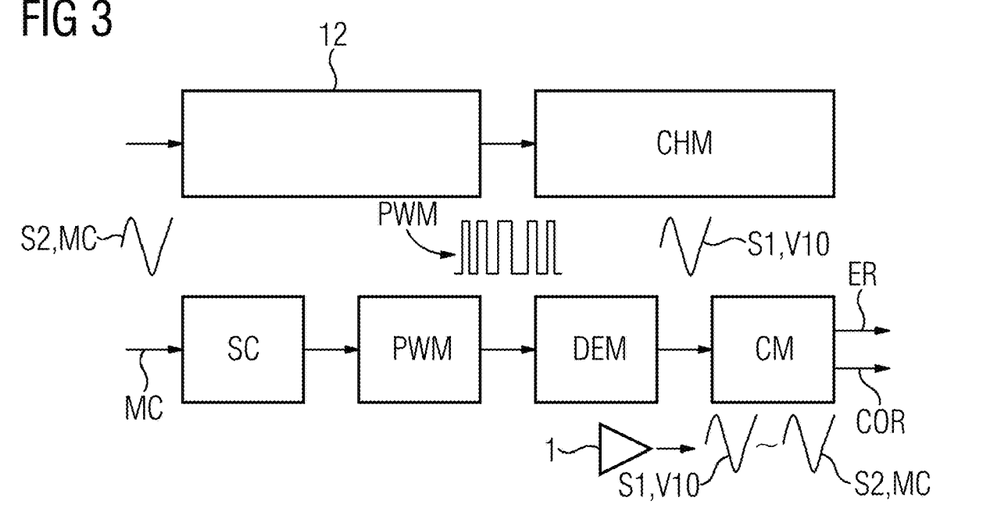
FIG. 3 depicts an exemplary schematic overview for determining an incorrect or correct operating state of an electrical machine.

FIG. 3 shows, by way of example, an overview of the method for determining the incorrect operating state of the electrical machine 10. The motor current MC flows into the inverter 12. The inverter 12 generates a space vector SC from the motor current MC. This space vector SC may be transferred to a PWM modulation unit. The PWM modulation unit may generate the pulse width modulation signal PWM from the space vector SC. The pulse width modulation signal PWM may be generated with the aid of the inverter 12.

The pulse width modulation signal PWM may be supplied to a checking unit CM. The checking unit CM may generate a corresponding error signal ER or a confirmation signal COR based on a comparison of the first signal S1 with the second signal S2. In the example of FIG. 3, the first signal S1 is represented by a demodulated signal V10. The second signal S2 is represented by the motor current MC in FIG. 3. In order to generate the demodulated signal V10, the pulse width modulation signal PWM may be supplied to a demodulation unit DEM. The pulse width modulation signal PWM may be demodulated with the aid of a low-pass filter LP, for example.

The demodulated pulse width modulation signal V10 may be supplied to a consistency unit CM. The consistency unit CM may check, in particular, whether the signal of the motor current MC and the demodulated signal V10 from the demodulation unit DEM are similar to one another. In the case of a hardware check, as proposed by the disclosure, the consistency unit CM is implemented in the form of the switching arrangement 100. In particular, the consistency unit CM may compare the demodulated pulse width modulation signal V10 with the motor current MC.

In this example, it should be noted that the consistency unit CM or the switching arrangement 100 cannot only compare numerical values with one another but rather, as indicated in FIG. 3, may compare different signal profiles with one another. In this example, the switching arrangement 100 may carry out the comparison with the aid of the comparator 1. The comparison of the signal of the motor current MC with the demodulated pulse width modulation signal V10 from the demodulation unit DEM is schematically indicated in the lower region of FIG. 3.

Figure 4:
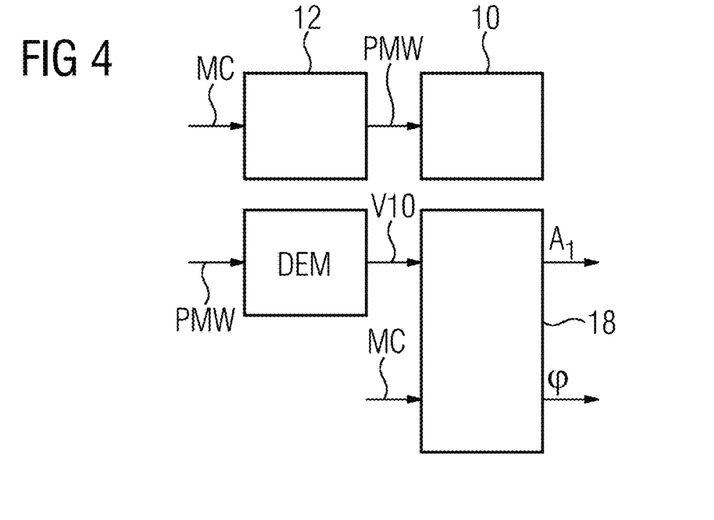
FIG. 4 depicts an exemplary schematic overview of PWM demodulation for a consistency check.

FIG. 4 shows, by way of example, how the signals for checking may be generated for the consistency unit CM. For each phase of the electrical machine 10 or corresponding motor phase, the output signal of the pulse width modulation signal PWM may be demodulated with the aid of the demodulation unit DEM. The output signal of the pulse width modulation signal PWM may be a voltage signal, in particular. This voltage signal represents the pulse width modulation signal PWM in this example. It is therefore possible, instead of the pulse width modulation signal PWM or the demodulated pulse width modulation signal V10, to use a corresponding voltage signal for the comparison and to determine the incorrect operating state of the electrical machine 10. Accordingly, other variables, for example a rotational speed, a rotational angle, or a current intensity, may also be represented with the aid of a corresponding voltage signal or may be represented by a corresponding voltage signal. For each phase of the motor or of the electrical machine 10, the demodulated pulse width modulation signal V10 may be supplied to a lock-in amplifier 18. The demodulated pulse width modulation signal V10 may be considered to be an input parameter for the lock-in amplifier 18. The motor current MC or the associated motor current signal MC may likewise be supplied to the lock-in amplifier 18 as an input variable. Two further output signals may be generated with the aid of the lock-in amplifier 18.

A first output signal is a relative phase between the demodulated pulse width modulation signal V10 and the motor current signal MC. The other output signal is, in particular, a relative amplitude which describes a ratio of the respective amplitudes of the demodulated pulse width modulation signal V10 and the motor current signal MC. The signal for the relative amplitude may be referred to as a first relative signal A1. The signal for the relative phase may be referred to as a second relative signal φ. The first relative signal A1 and/or the second relative signal φ may be supplied to the at least one comparator 1 of the switching arrangement 100. The first relative signal A1 and the second relative signal φ may therefore have a reference to the first and second signals.

As an alternative to the lock-in amplifier 18, it is also possible to use an amplitude detector 27 and/or a phase detector 29. The demodulated PWM signal V10 and the motor current signal MC may be supplied to both detectors. This is indicated, by way of example, in FIG. 10.

Figure 5:
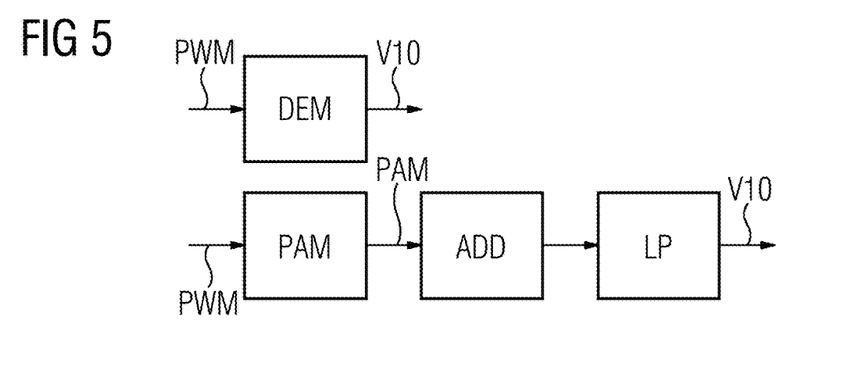
FIG. 5 depicts an exemplary illustration of demodulation of a pulse width modulation signal.

FIG. 5 shows, by way of example, a possible method for demodulating the pulse width modulation signal PWM. The pulse width demodulation unit DEM converts the pulse width modulation signal PWM into the demodulated signal V10. A pulse amplitude modulation unit PAM may convert the pulse width modulation signal PWM into a pulse amplitude modulated signal PAM for this purpose. Locally generated square-wave pulses (e.g., offset values) may be added to the pulse amplitude modulated signal PAM in this conversion. An addition unit ADD may be used for this purpose. In this example, the addition unit ADD may add offset values at particular points of the pulse amplitude modulation signal.

The modified pulse amplitude modulation signal may be converted into a signal with amplitude-modulated square-wave pulses with the aid of a clipper. It is thus possible to achieve the situation in which the amplitude-modulated square-wave signal is obtained from the pulse width modulation signal PWM. These square-wave pulses may be demodulated with the aid of a pulse amplitude demodulation unit LP in the further course of the method. The pulse amplitude demodulation unit LP may be in the form of a low-pass filter LP, in particular. This exemplary method for demodulating the pulse width modulation signal PWM may be used to generate a distortion-free signal which may enable a simpler check with the aid of the switching arrangement 100.

Figure 6:
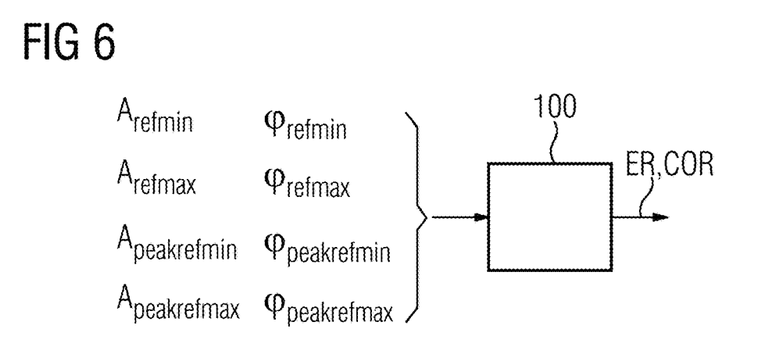
FIG. 6 depicts an exemplary illustration of reference values for the consistency check for determining the incorrect or correct operating state of the electrical machine.

FIG. 6 shows, by way of example, which parameters may be taken into account by the switching arrangement 100 in order to determine the incorrect operating state of the electrical machine 10. The first relative signal A1 is intended to be arranged in a predefined range, for example. This predefined range may be defined with the aid of a minimum amplitude reference value $A_{refmin}$ and a maximum amplitude reference value $A_{refmax}$.

It may likewise be necessary to check whether the second relative signal φ is in a predefined angular range. This angular range may be defined with the aid of a minimum phase reference value $\varphi_{refmin}$ and a maximum phase reference value $\varphi_{refmax}$.

During a changeover operation of the electrical machine 10, it may be necessary to change one or more of the reference values mentioned above. During a changeover of the electrical machine 10, peak values (peaks) may occur in terms of the amplitude or phase. The comparison values relevant to the changeover operation of the electrical machine 10 are referred to as peak values below. Therefore, a minimum amplitude reference peak value $A_{peakrefmin}$ and a maximum amplitude reference peak value $A_{peakrefmax}$ may be used for the comparison. With respect to the phase shift, a minimum phase reference peak value $\varphi_{peakrefmin}$ and a maximum phase reference peak value $\varphi_{peakrefmax}$ may be supplied to the switching arrangement 100 as input variables. The switching arrangement 100 may output the error signal ER or the confirmation signal COR as the result. If the error signal ER is output, this may indicate an incorrect state of the electrical machine 10.

If, when checking the control parameters $A_{refmin}$ to $\varphi_{peakrefmax}$ illustrated in FIG. 6, it is found that these control parameters fluctuate too highly and change too greatly within a predefined period, that is to say "jump back and forth", this may indicate incorrectly set software control. Under certain circumstances, particular control parameters of the electrical machine 10 cannot be set correctly.

In addition or as an alternative to the reference values shown in FIG. 6, it is possible to check whether the respective machine currents MC of the electrical machine 10 exceed a particular level.

The signals with respect to the machine currents may be subjected to a shape analysis, a similarity analysis, and a correlation. A level of the machine currents and a profile of the machine currents MC may therefore be determined. Depending on the deviation from a predefined machine current signal MC, an incorrect state of the electrical machine 10 may be inferred. Unusual machine currents MC may be caused, for example, by excessive internal friction in the electrical machine 10. A defect in hardware of the electrical machine 10 may therefore be reliably detected, for example.

Figure 7:
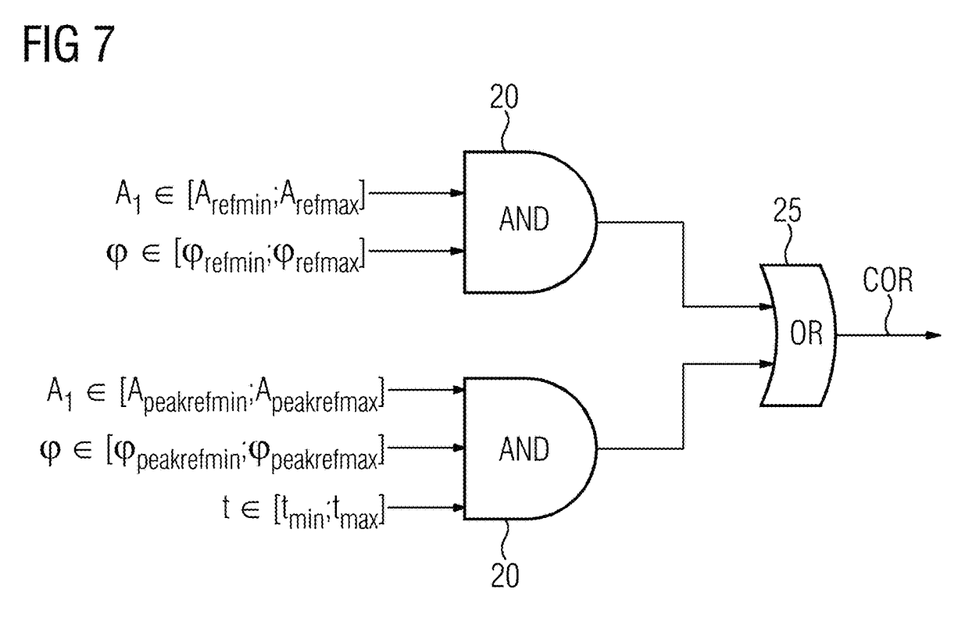
FIG. 7 depicts an exemplary switching arrangement for checking the state of the electrical machine based on two conditions.

FIG. 7 shows, by way of example, how two different checks may be used to determine whether the electrical machine 10 is operating correctly. In this example, a confirmation signal COR, rather than an error signal ER, is output. The two checks are implemented with the aid of a respective AND gate 20. In the upper first AND gate 20, a check is carried out in order to determine whether the first relative signal A1 is within the minimum amplitude reference value $A_{refmin}$ and the maximum amplitude reference value $A_{refmax}$. A check is likewise carried out in the first AND gate 20 in order to determine whether the second relative signal φ is within the associated range defined by the minimum phase reference value $\varphi_{refmin}$ and the maximum phase reference value $\varphi_{refmax}$.

The second AND gate 20 below the first AND gate in FIG. 7 takes into account a possible changeover operation of the electrical machine 10. In this example, a check is carried out in order to determine whether the first relative signal A1 is between the minimum amplitude reference peak value $A_{peakrefmin}$ and the maximum amplitude reference peak value $A_{peakrefmax}$. The same applies to the second relative signal φ. A check may be carried out in order to determine whether the second relative signal φ is between the minimum phase reference peak value $\varphi_{peakrefmin}$ and the maximum phase reference peak value $\varphi_{peakrefmax}$. The output signals from these two AND gates 20 may be supplied to an OR gate 25. If one of the two AND gates 20 therefore determines correct operation of the electrical machine 10, the OR gate 25 generates the confirmation signal COR.

The respective reference peak values for the amplitude or phase may be combined with a time condition. The second AND gate 20 may therefore take into account the fact that the reference peak values are each valid only for a predefined period tpm. The period tpm may be defined, for example, by two predefined time values Lam and $t_{max}$. These predefined time values take into account, in particular, a duration of the changeover operation of the electrical machine 10. If a time t is within the period tpm (t c tpm), the time condition is met. In this example, the first relative signal A1 and the second relative signal φ may be arranged in the respective reference peak ranges [$A_{peakrefmin}$; $A_{peakrefmax}$] and [$\varphi_{peakrefmim}$; $\varphi_{peakrefmax}$] and the confirmation signal COR would nevertheless be generated. A desired changeover of the electrical machine 10 may therefore result in the first relative signal A1 or the second relative signal φ not being in the ranges defined by the minimum and maximum phase reference values or the minimum or maximum amplitude reference values, but rather being outside these ranges.

The time condition tpm may be used to provide that the first relative signal A1 and the second relative signal φ are not permanently arranged in the reference ranges with the respective peak values without overlooking the incorrect state of the electrical machine 10. In the case of the changeover operation of the electrical machine 10, the reliable range of the phase reference value or of the amplitude reference value may therefore be modified for the predefined period tpm. These modified values are represented by the respective peak values. If one of the two AND gates 20 reveals the incorrect state of the electrical machine 10, a control signal may be generated for the electrical machine 10, which control signal is configured to change the electrical machine 10 or the drive 5 to a safe state.

Figure 8:
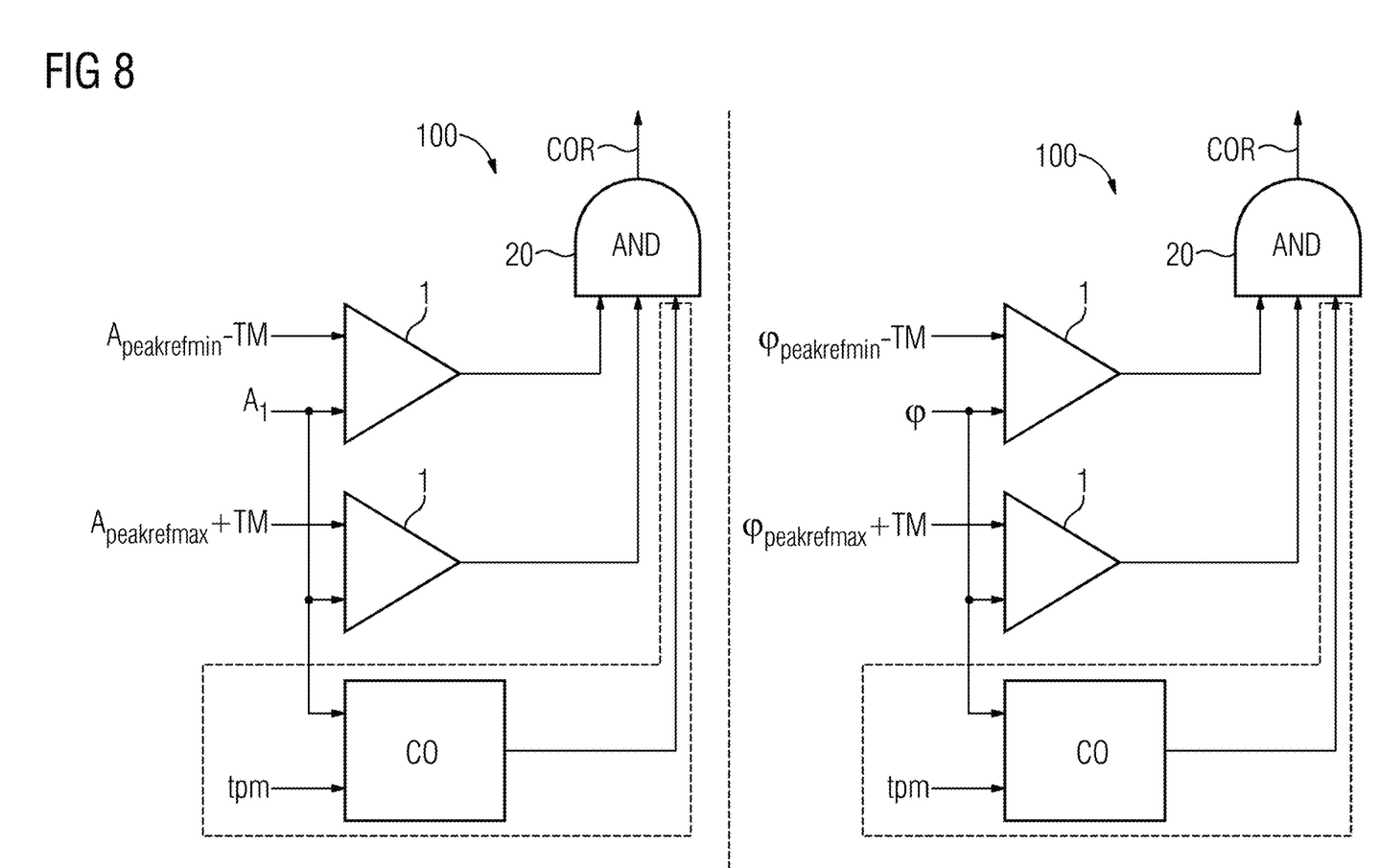
FIG. 8 depicts a further exemplary switching arrangement having a plurality of comparators and AND gates for generating the confirmation signal for determining a correct operating state of the electrical machine.

FIG. 8 shows two possible switching arrangements 100 for determining the incorrect operating state of the electrical machine 10. These two switching arrangements 100 are very similar to one another. They differ from one another, in particular, in the fact that the left-hand switching arrangement 100 subjects the first relative signal A1 to the comparison, while the right-hand switching arrangement 100 compares the second reference signal φ with the corresponding phase values. The first relative signal A1 may be obtained with the aid of the lock-in amplifier 18. The first relative signal A1 is compared with the minimum amplitude reference peak value $A_{peakrefmin}$ with the aid of the first comparator 1. The minimum amplitude reference peak value $A_{peakrefmin}$ may be reduced by a tolerance value TM. In this example, the comparator 1 is configured in such a manner that it outputs a comparison signal if the first relative signal A1 is above the minimum reference peak value. At the same time, the first relative signal is supplied to a second comparator 1. The first relative signal A1 is compared with the maximum amplitude reference peak value $A_{peakrefmax}$ in the second comparator 1. The maximum amplitude reference peak value $A_{peakrefmax}$ may likewise be increased by the tolerance value TM. Any value shown in FIG. 8 for the comparison may be increased or reduced by a different tolerance amount TM in each case. The second comparator 1 may therefore determine using hardware whether the first relative signal A1 is below the maximum amplitude reference peak value $A_{peakrefmax}$. If this is the case, the second comparator 1 outputs a corresponding signal which is supplied to the AND gate 20.

The switching arrangement 100 enables a plurality of parallel comparisons. For example, the comparisons may be carried out with relatively low peak values and a greater time interval, with relatively average peak values and an average time interval and with relatively high peak values and a short time interval.

In the example of FIG. 8, the first relative signal A1 may be additionally supplied to a counting unit CO. The counting unit CO may be in the form of a pulse counter CO and is used to link the first relative signal A1 to a time condition. If the pulse counter CO reveals that the first relative signal occurs within the predefined period tpm, the pulse counter CO may generate a corresponding output signal which indicates that the first relative signal A1 has occurred within the predefined period tpm. This output signal is also supplied to the AND gate 20. The predefined period tpm may be supplied to the pulse counter CO by a corresponding time signal tpm. In the example of FIG. 8, three output signals are therefore supplied to the AND gate 20. The first and second comparators 1 determine using hardware whether the first relative signal A1 is between the minimum amplitude reference peak value $A_{peakrefmin}$ and the maximum amplitude reference peak value $A_{peakrefmax}$. At the same time, the pulse counter CO is used to check whether the first relative signal A1 is within the predefined period defined by the time signal tpm.

Instead of the first relative signal A1, the right-hand switching arrangement 100 compares the second relative signal φ with the corresponding phase reference peak values. The explanations for the left-hand switching arrangement 100 may be correspondingly and analogously applied to the right-hand switching arrangement 100.

The switching arrangements 100 shown in FIG. 8 may be designed without the counting units CO. This means that the switching arrangement 100 shown in FIG. 8 may be designed without the counting unit CO framed with a dashed line. Such a switching arrangement 100 may be used to compare the two relative signals A1 and φ with the minimum and maximum amplitude reference values $A_{refmin}$, $A_{refmax}$ and with the minimum and maximum phase reference values $\varphi_{refmin}$, $\varphi_{refmax}$. In this example, only two output signals are respectively supplied to the respective AND gate 20. In this example, the first relative signal A1 may be compared with the minimum amplitude reference value $A_{refmin}$ and the maximum amplitude reference value $A_{refmax}$. In this case too, the respective reference value may differ by a tolerance amount TM.

The second relative signal φ may likewise be compared with the minimum phase reference value $\varphi_{refmin}$ and the maximum phase reference value $\varphi_{refmax}$. If the second relative signal φ is between the minimum and maximum phase reference values, the corresponding AND gate may output the confirmation signal COR. The switching arrangement 100 may accordingly be modified in such a manner that the error signal ER, instead of the confirmation signal COR, is generated in the case of the incorrect state of the electrical machine 10. The AND gate 20 may be implemented using a logic circuit or an equivalent electronic circuit. The pulse counter CO may respectively be used when comparing the two relative signals with respect to the reference peak values, which pulse counter takes into account the time signal tpm in order to determine the confirmation signal COR or in order to determine the error signal ER.

Figure 9:
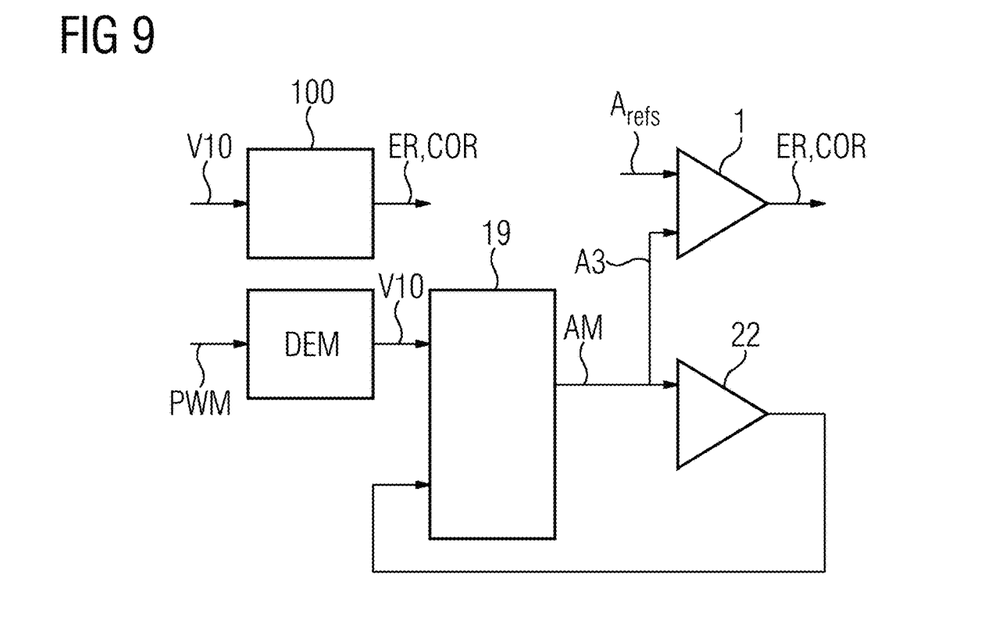
FIG. 9 depicts an exemplary illustration for determining an overspeed of the electrical machine.

FIG. 9 schematically shows how an overspeed of the electrical machine 10 may be determined. In order to check an overspeed of the electrical machine 10, the demodulated signal V10 is checked with the aid of the switching arrangement 100. During this check, similar method acts to those explained above may be carried out for the comparison. Depending on the result of the comparison, the error signal ER or the confirmation signal COR may be generated.

The pulse width modulation signal PWM is first of all demodulated with the aid of the demodulation unit DEM. This demodulated signal V10 is supplied to the differentiator 19. When checking the overspeed of the electrical machine 10, the frequency of the current measurement for the motor current signal MC may be used to check whether the angular velocity of the drive unit 5 is below a permitted maximum value.

For this purpose, the differentiator 19 illustrated in FIG. 9 may accordingly convert the demodulated signal V10 into an amplitude signal AM. The amplitude signal AM may be supplied to a voltage-controlled oscillator 22. The voltage-controlled oscillator 22 is configured, in particular, in such a manner that it iteratively changes amplitude of the amplitude signal AM in such a manner that the frequency of the sinusoidal signal at the output of the voltage-controlled oscillator 22 corresponds to the frequency of the demodulated signal V10. The arrangement of the differentiator 19 and the voltage-controlled oscillator 22 is also known as a phase-locked loop. A third relative signal A3 may therefore be generated from the amplitude signal AM.

Alternatively, the voltage-controlled oscillator 22 may iteratively change the amplitude of the amplitude signal AM in such a manner that an output signal is iteratively generated at the voltage-controlled oscillator 22, the frequency of which output signal corresponds to the frequency of the motor current signal MC. In this example, the third relative signal A3 has the same frequency as the second signal S2. The second signal S2 may represent the motor current MC, for example. It is therefore possible to achieve the situation in which the third relative signal A3 formed at the differentiator 19 has the same frequency as the motor current signal MC. A phase-consistent check of the overspeed or a rotational speed of the electrical machine 10 may therefore be enabled. After the iterative change of the amplitude signal AM into the third relative signal A3 has been completed, the third relative signal is supplied to the comparator 1 for the comparison. The comparator 1 shown in FIG. 9 may compare the new third relative signal A3 with a new reference value $A_{refs}$. The reference value $A_{refs}$ represents a speed reference value $A_{refs}$, in particular. The speed reference value $A_{refs}$ may represent, for example, a permissible limit value for a rotational speed of the electrical machine 10. The error signal ER or the confirmation signal COR may be output by the comparator 1 depending on the comparison.

Figure 10:
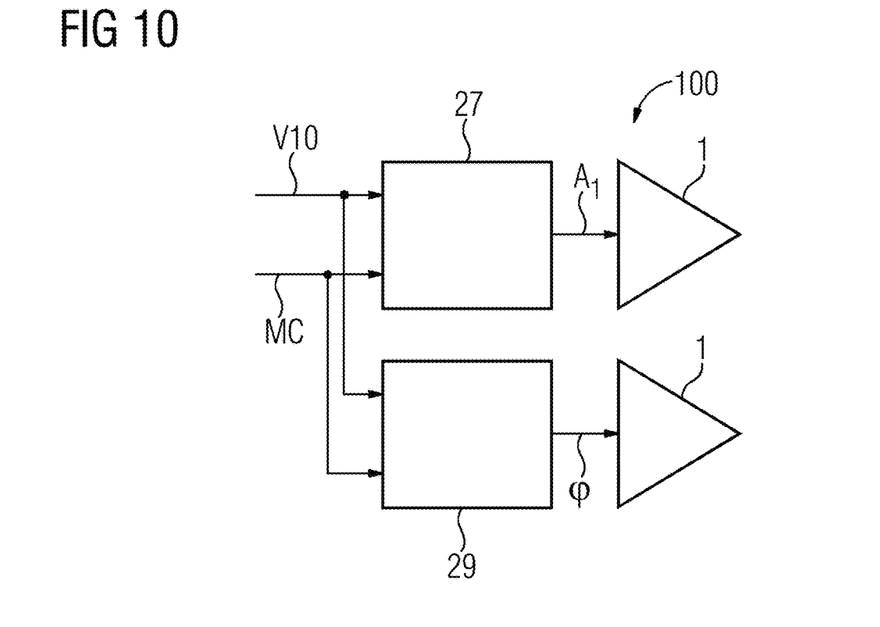
FIG. 10 depicts an exemplary switching arrangement having an amplitude detector and a phase detector.

FIG. 10 shows an additional or alternative embodiment of the switching arrangement 100. In this example, the switching arrangement 100 has the amplitude detector 27 and the phase detector 29. It is also possible for only one of the two detectors to be used. The amplitude detector 27 may generate the first relative signal A1, and the phase detector 29 may generate the second relative signal φ. The relative signals A1, φ may each be supplied to the at least one comparator 1 for the comparison. The first relative signal A1 may describe the amplitude ratio of the first and second signals with respect to one another. The first signal is described, in particular, by the demodulated pulse width modulation signal V10, and the second signal is described, in particular, by the motor current signal MC. The motor current signal MC describes, in particular, a rotational speed, a rotational angle or a current intensity of the electrical machine 10. The second relative signal φ describes the phase shift from the first signal to the second signal.

The switching arrangement 100 may have the control unit 14, the demodulation unit DEM, and the at least one comparator 1. The switching arrangement 100 may additionally have the lock-in amplifier 18 (e.g., quadrature detector), the differentiator 19, the voltage-controlled oscillator 22, the AND gate 20, the pulse counter CO, the power electronic unit 16, the OR gate 25, the addition unit AND, the checking unit CM, the pulse amplitude modulation unit LP (low-pass filter) and/or the pulse amplitude modulation unit PAM.

Alternatively, the switching arrangement 100 may be used to directly check the machine currents MC. For example, the switching arrangement 100 having the at least one comparator 1 may be used to check whether a current intensity of the motor current signal MC is within a predefined current intensity range. This checking of the current intensity may be used for each phase in the case of a three-phase current. The motor current signal MC may be captured or measured with the aid of current sensors. If such a check of the current intensity reveals an excessive deviation of the current intensity from a predefined current intensity range, this may indicate a defect in the current sensors or a fault in the electrical machine 10. In this example, the drive unit 5 may be changed to a safe state.

The examples mentioned therefore show that the state of the electrical machine 10 may be reliably checked with the aid of a hardware switching arrangement 100. This hardware check may achieve failure rates of $10^{-9}$ failures per hour or even less. Such checking of the functional state of the electrical machine 10 may be useful, for example, in the automotive sector, in aviation or in machine tools. The electrical machine 10 may therefore be checked even when a corresponding software application is not available or is not operating.

Although the disclosure has been illustrated and described in greater detail by the exemplary embodiments, the disclosure is not restricted by these exemplary embodiments. Other variations may be derived herefrom by the person skilled in the art, without departing from the scope of protection of the disclosure. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

LIST OF REFERENCE SIGNS

1 Comparator
5 Drive unit
10 Electrical machine
12 Inverter
14 Control unit
14a Storage unit
14b Interface
14c Analog/digital converter
14d Microprocessor
14e PWM generator
14f Microprocessor protection unit
14g Machine protection unit
14h Hardware protection unit
14i PWM activation unit
16 Power electronic unit
18 Lock-in amplifier—quadrature detector
19 Differentiator
20 AND gate
22 Oscillator
25 OR gate
27 Amplitude detector
29 Phase detector
100 Switching arrangement
A1 First relative signal
ADD Addition unit
$A_{refmin}$ Minimum amplitude reference value
$A_{refmax}$ Maximum amplitude reference value
$A_{refs}$ Speed reference value
$A_{peakrefmin}$ Minimum amplitude reference peak value
$A_{peakrefmax}$ Maximum amplitude reference peak value
$\varphi_{refmin}$ Minimum phase reference value
$\varphi_{refmax}$ Maximum phase reference value
$\varphi_{peakrefmin}$ Minimum phase peak reference value
$\varphi_{peakrefmax}$ Maximum phase peak reference value
$t_{min}, t_{max}$ Predefined time values
CHM Consistency check
CM Checking unit
COR Confirmation signal
DEM Demodulation unit
LP Pulse amplitude modulation unit, low-pass filter
MC Motor current, motor current signal
PAM Pulse amplitude modulation unit
PWM Pulse width modulation
SC Space-time vector
TM Tolerance value, tolerance amount
tpm Period, time signal
V10 Demodulated pulse width modulation signal
$\varphi$ Second relative signal
A3 Third relative signal
AM Amplitude signal
ER Error signal
CO Pulse counter

The invention claimed is:

1. A method for determining an incorrect operating state of an electrical machine with aid of an electronic circuit having at least one comparator, the method comprising:
controlling the electrical machine with a pulse width modulation signal;
demodulating the pulse width modulation signal;
comparing, by the at least one comparator, a first signal with a second signal, wherein the first signal represents the demodulated pulse width modulation signal, and wherein the second signal represents a rotational speed or a rotational angle of the electrical machine and/or a current intensity of the electrical machine; and
generating an error signal based on the comparing; and
determining the incorrect operating state of the electrical machine based on the error signal.

2. The method of claim 1, wherein the at least one comparator comprises a plurality of comparators, and wherein the comparing further comprises:
generating a first relative signal from the first signal and the second signal using a lock-in amplifier, wherein the first relative signal describes an amplitude ratio of the first signal and the second signal with respect to one another;
comparing the first relative signal with a predefined minimum amplitude reference value by a first comparator of the plurality of comparators; and
comparing the first relative signal with a predefined maximum amplitude reference value by a second comparator of the plurality of comparators.

3. The method of claim 2, wherein, during the comparing:
the predefined minimum amplitude reference value and/or a minimum phase reference value is/are reduced for a predefined period; and/or
the predefined maximum amplitude reference value and/or a maximum phase reference value is/are increased for the predefined period.

4. The method of claim 2, wherein the error signal is generated when the first relative signal is outside of an amplitude range defined by the predefined minimum amplitude reference value and the predefined maximum amplitude reference value.

5. The method of claim 2, wherein the comparing further comprises:
generating a second relative signal from the first signal and from the second signal using the lock-in amplifier, wherein the second relative signal describes a phase shift from the first signal to the second signal;

comparing the second relative signal with a predefined minimum phase reference value by a third comparator of the plurality of comparators; and comparing the second relative signal with a predefined maximum phase reference value by a fourth comparator of the plurality of comparators.

6. The method of claim 5, wherein, during the comparing:

the predefined minimum amplitude reference value and/or the predefined minimum phase reference value is/are reduced for a predefined period; and/or the predefined maximum amplitude reference value and/or the predefined maximum phase reference value is/are increased for the predefined period.

7. The method of claim 5, wherein the error signal is generated when the first relative signal is outside of an amplitude range defined by the predefined minimum amplitude reference value and the predefined maximum amplitude reference value, or the second relative signal is outside of a phase range defined by the predefined minimum phase reference value and the predefined maximum phase reference value.

8. The method of claim 2, wherein a third relative signal is formed from the first signal by a differentiator, and wherein the differentiator, in conjunction with a voltage-controlled oscillator, modulates an amplitude of the first relative signal such that a frequency of the third relative signal corresponds to a frequency of the first signal, a frequency of the demodulated pulse width modulation signal, or a frequency of the second signal.

9. The method of claim 2, wherein an output voltage which respectively results with aid of the plurality of comparators during each comparison is supplied to an AND gate.

10. The method of claim 1, wherein, in order to demodulate the pulse width modulation signal, the pulse width modulation signal is converted into a pulse amplitude modulation signal, and wherein the pulse amplitude modulation signal is supplied to a low-pass filter.

11. A switching arrangement comprising:

at least one comparator for determining an incorrect operating state of an electrical machine;

a control unit for controlling the electrical machine with a pulse width modulation signal; and a demodulation unit for demodulating the pulse width modulation signal, wherein the at least one comparator is configured to compare a first signal with a second signal, wherein the first signal represents the demodulated pulse width modulation signal, and wherein the second signal represents a rotational speed or a rotational angle of the electrical machine and/or a current intensity of the electrical machine, and wherein the at least one comparator and/or the control unit is/are configured to generate an error signal based on the comparison and determine the incorrect operating state of the electrical machine based on the error signal.

12. The switching arrangement of claim 11, further comprising:

a lock-in amplifier configured to generate a first relative signal and a second relative signal, wherein the first relative signal describes an amplitude ratio of the first signal and the second signal with respect to one another, and wherein the second relative signal describes a phase shift from the first signal to the second signal, in order to compare one realtive signal of the first and second relative signals with a further reference signal by the at least one comparator; and at least one AND gate connected to an output signal from the at least one comparator.

13. The switching arrangement of claim 12, further comprising:

at least one pulse counter configured to predefine a period, wherein the at least one pulse counter is connected to the at least one AND gate.

* * * * *

UNITED STATES PATENT AND TRADEMARK OFFICE
CERTIFICATE OF CORRECTION

| | |
|---|---|
| PATENT NO. | : 11,594,997 B2 |
| APPLICATION NO. | : 17/031373 |
| DATED | : February 28, 2023 |
| INVENTOR(S) | : Wolfram Siegfried Birkmayer |

It is certified that error appears in the above-identified patent and that said Letters Patent is hereby corrected as shown below:

On the Title Page

Item (30) should read:
September 30, 2019 (DE) ......................... 10 2019 215 014.4

Signed and Sealed this
Eighteenth Day of April, 2023

Katherine Kelly Vidal
*Director of the United States Patent and Trademark Office*